(12) United States Patent  
Melvin, III et al.

(10) Patent No.: US 11,556,052 B2  
(45) Date of Patent: Jan. 17, 2023

(54) USING MASK FABRICATION MODELS IN CORRECTION OF LITHOGRAPHIC MASKS

(71) Applicant: Synopsys, Inc., Mountain View, CA (US)

(72) Inventors: Lawrence S. Melvin, III, Hillsboro, OR (US); Kevin J. Hooker, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 86 days.

(21) Appl. No.: 17/089,190

(22) Filed: Nov. 4, 2020

(65) Prior Publication Data

US 2021/0132486 A1 May 6, 2021

Related U.S. Application Data

(63) Continuation of application No. PCT/US2020/058609, filed on Nov. 2, 2020.

(Continued)

(51) Int. Cl.
*G03F 1/20* (2012.01)
*G03F 1/36* (2012.01)
(Continued)

(52) U.S. Cl.
CPC .............. *G03F 1/20* (2013.01); *G03F 1/36* (2013.01); *G03F 7/705* (2013.01);
(Continued)

(58) Field of Classification Search
CPC ..... G03F 1/20; G03F 1/78; G03F 1/70; G03F 1/36; G03F 7/70441; G03F 7/705; G03F 7/70625; H01L 21/0337
See application file for complete search history.

(56) References Cited

U.S. PATENT DOCUMENTS 4,814,615 A * 3/1989 Fushimi .............. H01J 37/3174  
    250/397  
7,297,453 B2 * 11/2007 Watson .................... G03F 1/84  
    430/30

(Continued)

FOREIGN PATENT DOCUMENTS

TW         201925912 A     7/2019  
WO    WO 2019/162346 A1     8/2019

OTHER PUBLICATIONS

PCT International Search Report and Written Opinion, PCT Application No. PCT/US2020/058609, dated Feb. 19, 2021, 14 pages.

(Continued)

*Primary Examiner* — Helen Rossoshek  
(74) *Attorney, Agent, or Firm* — Fenwick & West LLP

(57) ABSTRACT

A lithography process is described by a design for a lithographic mask and a description of the lithography configuration, which may include the lithography source, collection/illumination optics, projection optics, resist, and/or subsequent fabrication steps. The actual lithography process uses a lithographic mask fabricated from the mask design, which may be different than the nominal mask design. A mask fabrication model models the process for fabricating the lithographic mask from the mask design. Typically, this is an electron-beam (e-beam) process, which includes e-beam exposure of resist on a mask blank, processing of the exposed resist to form patterned resist, and etching of the mask blank with the patterned resist. The mask fabrication model, usually in conjunction with other process models, is used to estimate a result of the lithography process. Mask correction is then applied to the mask design based on the simulation result.

18 Claims, 9 Drawing Sheets

Related U.S. Application Data

(60) Provisional application No. 62/930,134, filed on Nov. 4, 2019.

(51) Int. Cl.
 H01L 21/033 (2006.01)
 G03F 7/20 (2006.01)

(52) U.S. Cl.
 CPC ...... G03F 7/70441 (2013.01); G03F 7/70625 (2013.01); H01L 21/0337 (2013.01)

(56) References Cited

U.S. PATENT DOCUMENTS

| | | | | |
|---|---|---|---|---|
| 8,719,739 | B2* | 5/2014 | Fujimura | G06F 30/367 |
| | | | | 716/53 |
| 9,671,686 | B2* | 6/2017 | Choi | G03F 1/36 |
| 10,025,198 | B2* | 7/2018 | Cao | G03F 7/70666 |
| 10,656,528 | B1* | 5/2020 | Liu | G03F 1/76 |
| 2005/0091013 | A1* | 4/2005 | Gallatin | G03F 1/70 |
| | | | | 703/2 |
| 2006/0273266 | A1* | 12/2006 | Preil | G03F 7/70666 |
| | | | | 430/311 |
| 2007/0061773 | A1 | 3/2007 | Ye et al. | |
| 2009/0307649 | A1 | 12/2009 | Pramanik et al. | |
| 2010/0269086 | A1 | 10/2010 | Granik | |
| 2011/0271240 | A1* | 11/2011 | Hurley | G03F 1/70 |
| | | | | 716/55 |
| 2012/0141924 | A1* | 6/2012 | Sahouria | G03F 1/76 |
| | | | | 430/5 |
| 2012/0284675 | A1* | 11/2012 | Shi | G03F 1/24 |
| | | | | 716/53 |
| 2016/0078166 | A1* | 3/2016 | Ünal | G03F 7/70625 |
| | | | | 716/51 |
| 2017/0053056 | A1 | 2/2017 | Huang et al. | |
| 2017/0124247 | A1* | 5/2017 | Fujimura | G03F 1/36 |
| 2018/0173108 | A1* | 6/2018 | Hofmann | G03F 7/70441 |
| 2019/0113837 | A1* | 4/2019 | Wang | G03F 1/36 |
| 2019/0146328 | A1* | 5/2019 | Huang | G03F 1/36 |
| | | | | 430/5 |
| 2019/0163048 | A1* | 5/2019 | Choi | G03F 1/36 |
| 2019/0187570 | A1* | 6/2019 | Mack | H01J 37/222 |
| 2019/0197213 | A1 | 6/2019 | Ungar | |
| 2019/0272623 | A1* | 9/2019 | Mack | G06F 17/18 |
| 2021/0116803 | A1* | 4/2021 | Jung | H01L 21/0274 |
| 2021/0191254 | A1* | 6/2021 | Huang | G03F 1/36 |
| 2022/0043356 | A1* | 2/2022 | Zhang | G03F 7/705 |
| 2022/0068594 | A1* | 3/2022 | Mack | G01Q 30/06 |
| 2022/0179325 | A1* | 6/2022 | Hsu | G03F 7/70633 |

OTHER PUBLICATIONS

Taiwan Intellectual Property Office, Office Action, Taiwanese Patent Application No. 109138421, dated Oct. 28, 2021, 15 pages.

* cited by examiner

USING MASK FABRICATION MODELS IN CORRECTION OF LITHOGRAPHIC MASKS

CROSS-REFERENCE TO RELATED APPLICATION(S)

This application is a continuation of International Patent Application Serial No. PCT/US20/58609, "Using Mask Fabrication Models in Correction of Lithographic Masks," filed Nov. 2, 2020. This application also claims priority under 35 U.S.C. § 119(e) to U.S. Provisional Patent Application Ser. No. 62/930,134, "Simulated Lithography Mask in OPC Correction," filed Nov. 4, 2019. The subject matter of all of the foregoing is incorporated herein by reference in their entirety.

TECHNICAL FIELD

The present disclosure relates to photolithography (aka, lithography) and, more particularly, to modeling mask fabrication in order to improve the design of lithographic masks.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer, exposing resist on the wafer according to the illumination pattern. The patterned resist is then used in a process to fabricate structures on the wafer.

Various technologies are directed to improving the lithography process, including the design of the lithographic mask. In many of these technologies, the lithographic mask design is used as an input to some process model, which then predicts some process result. This result may be used to modify the design of the lithographic mask. In many cases, the process model may be regressed against data from actual fabrication experiments. Different lithographic mask designs containing test patterns are run through the lithographic process. The resulting structures are measured and used to calibrate the process model.

Current process models typically do not directly address effects that may occur during the fabrication of the mask itself. Rather, the lithographic mask design is used as input to the process model and any effects of mask fabrication are lumped together with other process effects and presumably accounted for by the regression against empirical data. However, as lithography moves to shorter wavelength ranges (e.g., extreme ultraviolet (EUV) at approximately 13.3-13.7 nm) and smaller geometries (e.g., 10 nm, 7 nm and smaller technology nodes, with approximately 20 nm, 14 nm and smaller minimum feature sizes), sensitivity to these mask fabrication effects is increasing and the conventional lumped approach may result in sub-optimal mask designs.

SUMMARY

Certain aspects relate to a method for improving designs of lithographic masks. A lithography process is described by a design for a lithographic mask and a description of the lithography configuration, which may include the lithography source, collection/illumination optics, projection optics, resist, and/or subsequent fabrication steps. The actual lithography process uses a lithographic mask fabricated from the mask design, which may be different than the nominal mask design. A mask fabrication model models the process for fabricating the lithographic mask from the mask design. Typically, this is an electron-beam (e-beam) process, which includes e-beam exposure of resist on a mask blank, processing of the exposed resist to form patterned resist, and etching of material on the mask blank according to the patterned resist. The mask fabrication model, usually in conjunction with other process models, is used to estimate a result of the lithography process, for example the aerial image illuminating the wafer, a printed pattern on the wafer or critical dimensions of the printed pattern. Mask correction is then applied to the mask design based on the estimated result. This process may be repeated for a number of iterations.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to the use of mask fabrication models for the correction of lithographic masks. As lithography moves to shorter wavelength ranges (e.g., EUV at approximately 13.3-13.7 nm) and smaller geometries (e.g., 10 nm, 7 nm and smaller technology nodes, with 20 nm, 14 nm and smaller feature sizes), the process for designing lithographic masks and simulating their use in the fabrication of integrated circuits becomes more complex. Effects that were non-existent or negligible at longer wavelengths and larger geometries may no longer be ignored. For example, higher photon energies result in lower photon counts for equal energy exposure. This can result in stochastic defect mechanisms that were previously negligible or non-existent.

The design of the lithographic mask is an important part of the overall design process. Typically, mask design uses mask correction technologies. An "ideal" or "drawn" mask design is first produced. However, the drawn mask design does not account for sub-wavelength, scattering and other process effects present at advanced technology nodes. Therefore, the drawn mask design is corrected to create a "corrected" mask design which, when used in the actual lithography process, will produce a result close to the drawn design. The mask corrections typically are applied to the full chip design. Various process models may be used as part of the mask correction process. However, these process models typically do not include a model of the process for fabricating the mask, and the mask fabrication process can produce non-negligible effects at advanced technology nodes.

In various embodiments of the present disclosure, a mask fabrication model is incorporated into the mask correction process. The use of a separate mask fabrication model, rather than lumping effects of mask fabrication into a more general process model, can increase the accuracy of the modeling and improve the overall results. In some cases, the separate mask fabrication model takes mask variations from being handled as random effects to being handled as systemic impacts that can be corrected. One possible effect of this change includes more accurate corrections that reduce manufacturing defect count (such as line breaks and shorts) and line edge roughness (LER). This improves yield on the wafer and reduces stochastic variations, such as variations in critical dimension (CD), leading to more uniform device performance.

Figure 1:
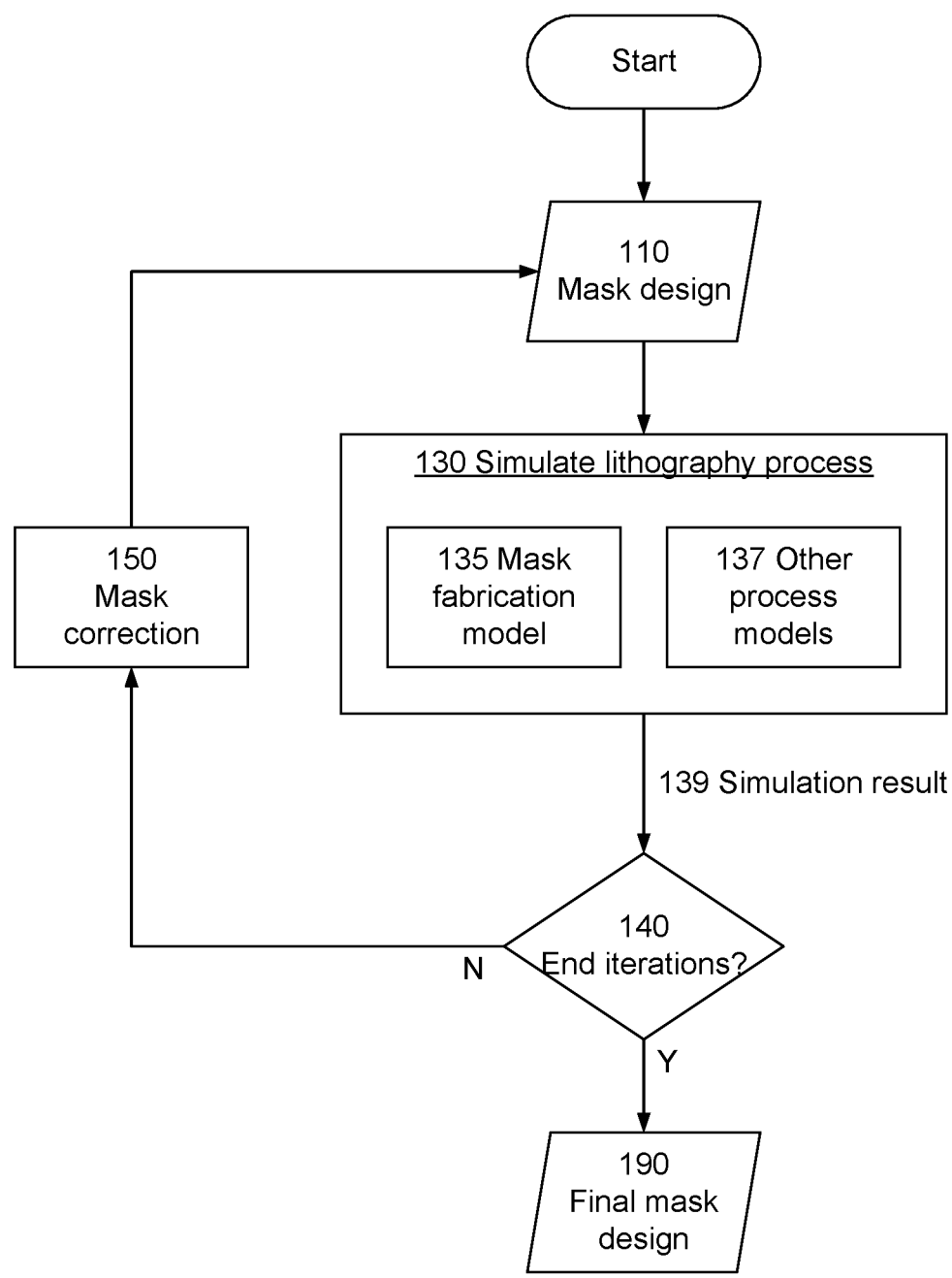
FIG. 1 depicts a flowchart for improving a design of a lithographic mask in accordance with some embodiments of the present disclosure.

FIG. 1 depicts a flowchart for improving a design of a lithographic mask in accordance with some embodiments of the present disclosure. This example process is iterative and applies mask correction 150 to the current design 110 of the lithographic mask, improving the mask design until the final design 190 is reached. An iteration begins with the current design 110 for the lithographic mask. The lithography process of interest is simulated 130 using the current mask design. The simulation is based on models for the lithography process, which include a mask fabrication model 135 and typically also other models for other parts of the lithography process. The modeling 130 of the lithography process produces some result 139 for the current mask design, such as the aerial image illuminating the wafer, a printed pattern on the wafer or critical dimensions (CD) of the printed pattern. The results may also account for different operating conditions, such as the CD over a range of exposure and defocus conditions. It may also include quantities calculated or derived metrics, such as the normalized image log-slope (NILS=w d(ln I)/dx where w is the normalized line width and d(ln I)/dx is the derivative of the log of the aerial image intensity) and mask error enhancement factor (MEEF=d($CD_{resist}$)/d($CD_{mask}$) where $CD_{resist}$ is the CD of a structure in the resist and $CD_{mask}$ is the CD of the corresponding pattern on the mask). A decision is made 140 whether to continue with more iterations. If so, mask correction 150 is applied to the current mask design to further improve the design and additional iterations are performed. If not, then the final mask design 190 is determined. The process may also be run non-iteratively.

Figure 2B:
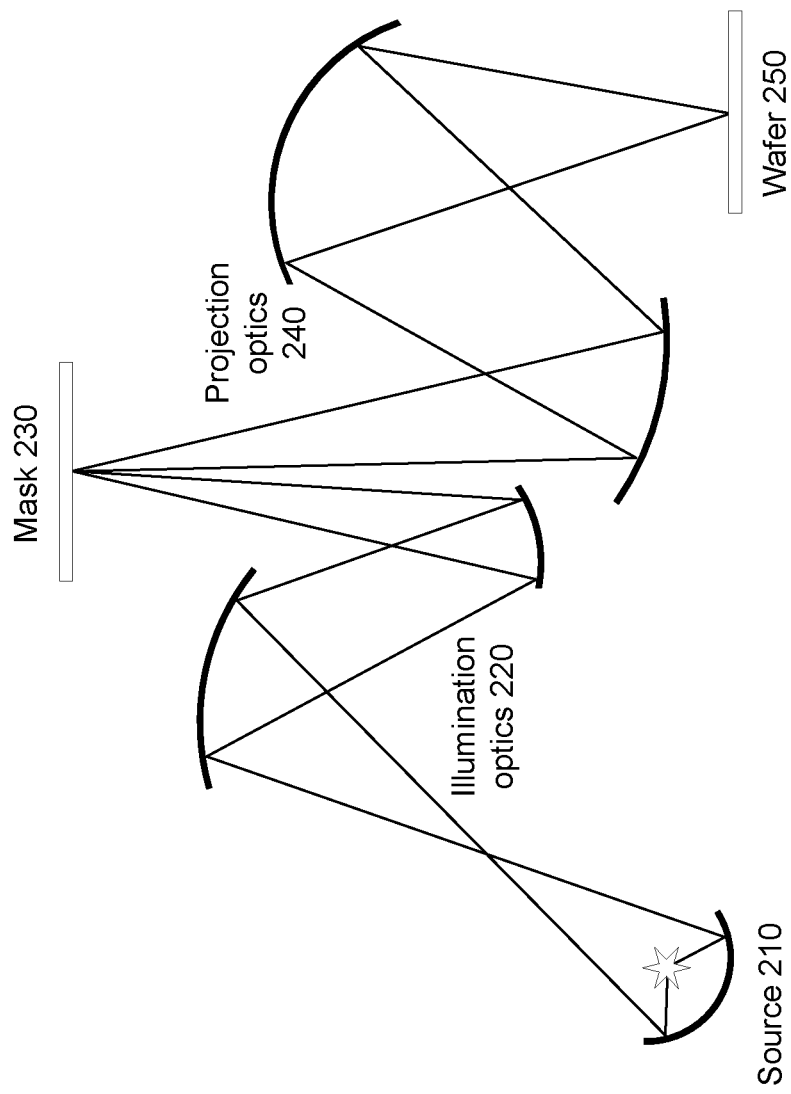
FIG. 2B depicts an EUV lithography process suitable for use with embodiments of the present disclosure.
Figure 2A:
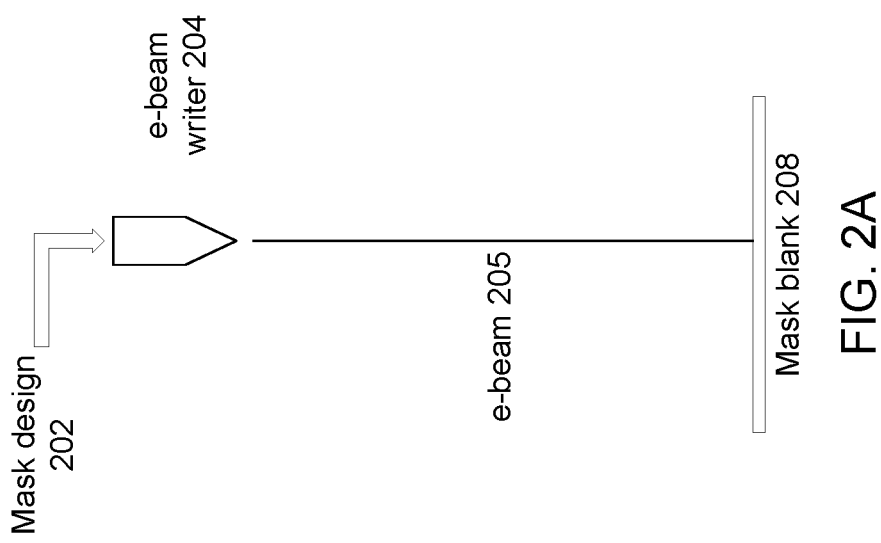
FIG. 2A depicts a mask fabrication process suitable for use with embodiments of the present disclosure.

The process of FIG. 1 will be explained in greater detail referring to FIGS. 2 and 3. FIG. 2A depicts a process for fabricating a lithographic mask from a mask design, and FIG. 2B depicts an extreme ultraviolet lithography process using the lithographic mask. In FIG. 2A, a mask design 202 is used to control an electron-beam (e-beam) writer 204. A mask blank 208 is coated with e-beam resist. To create an EUV lithographic mask, the mask blank is typically a substrate coated with alternating layers of Mo and Si which form a Bragg reflector, and then an absorber. Examples of abosorbers are compounds of Ta, for example some form of TaBON. There may also be capping layers, such as Ru.

The e-beam writer 204 controls an e-beam 205 to expose the resist according to the pattern of the mask design 202. The resist is developed, creating a pattern of resist on the mask blank 208. The materials of the underlying blank 208 are then processed. For example, for EUV masks, the underlying blank may contain a multi-layer reflector covered by an absorbing layer. Where the resist has been removed, the absorptive material is exposed and may be etched away to expose the underlying reflector, thus creating a reflective EUV lithographic mask.

The resulting mask is then used as the lithographic mask 230 in the lithography configuration shown in FIG. 2B. In this system, a source 210 produces EUV light that is collected and directed by collection/illumination optics 220 to illuminate a mask 230. Projection optics 240 relay the pattern produced by the illuminated mask onto a wafer 250, exposing resist on the wafer according to the illumination pattern. The exposed resist is then developed, producing patterned resist on the wafer. This is used to fabricate structures on the wafer, for example through deposition, doping, etching or other processes.

In FIG. 2B, the light is in the EUV wavelength range, around 13.5 nm or in the range 13.3-13.7 nm. At these wavelengths, the components typically are reflective, rather than transmissive. The mask 230 is a reflective mask and the optics 220, 240 are also reflective and off-axis. This is just an example. Other types of lithography systems may also be used, including at other wavelengths, using transmissive masks and/or optics, and using positive or negative resist.

Note that there are two different fabrication processes in FIGS. 2A and 2B. FIG. 2A shows fabrication of a lithographic mask. The lithographic mask is then used as one component in the fabrication process of FIG. 2B.

Figure 3A:
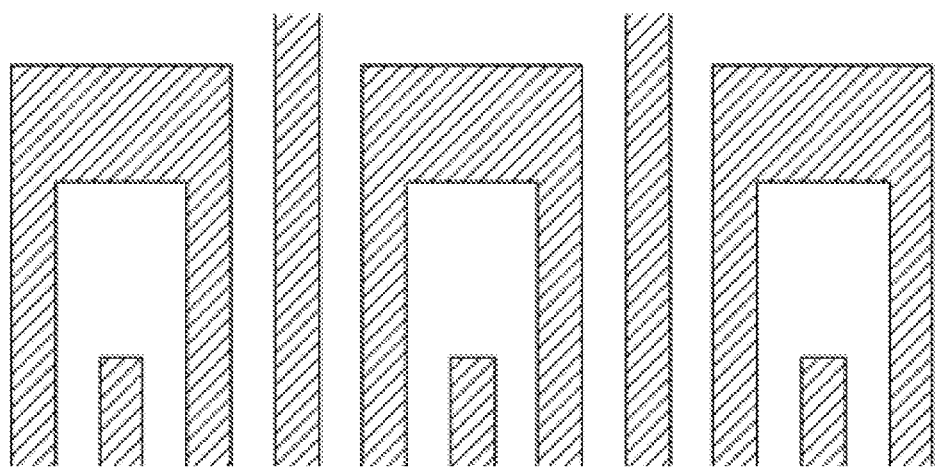
FIG. 3A depicts a drawn mask design.
Figure 3B:
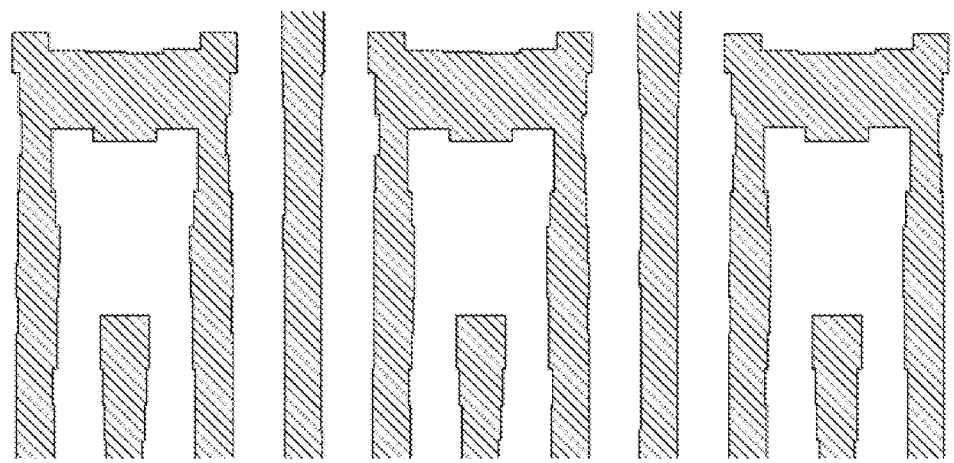
FIG. 3B depicts a corrected mask design.

Returning to FIG. 1, FIGS. 3A-3D depict different masks in the process of FIG. 1. The process of FIG. 1 typically begins with the "drawn" design of the lithographic mask, which represents the ideal shape of the resulting structure fabricated on the wafer. FIG. 3A depicts a drawn mask design. The drawn design is typically Manhattan geometry (i.e., edges are only horizontal and vertical) or sometimes additionally with edges at 45 (and 135) degree angles. FIG. 3B depicts a corrected mask design—i.e., a mask design after mask correction has been applied. It is still Manhattan geometry, but the edges have a more intricate shape. Various parts of the shapes are thicker or thinner than in the drawn design, in order to account for diffraction, scattering and other effects in projecting the lithographic mask onto the wafer.

Figure 3C:
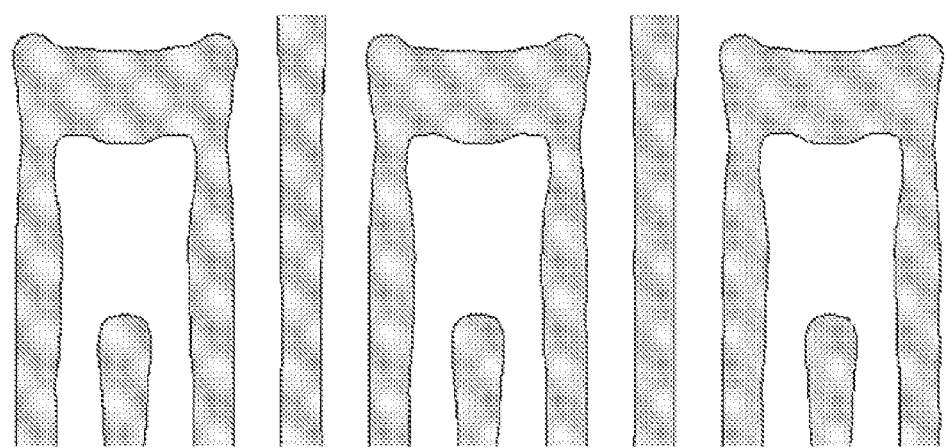
FIG. 3C depicts a printed mask pattern, in accordance with embodiments of the present disclosure.
Figure 3D:
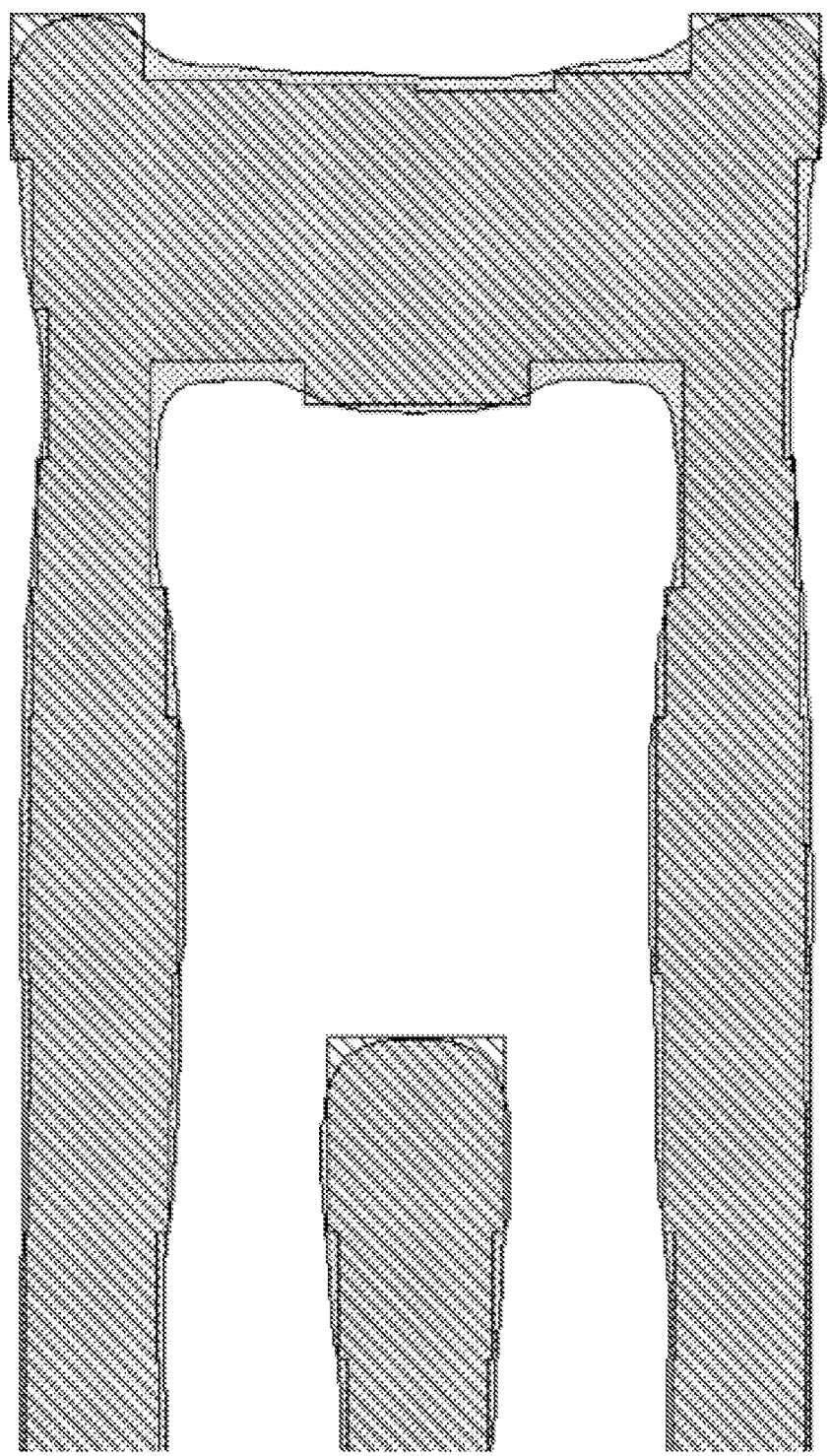
FIG. 3D depicts a comparison of the corrected mask design and printed mask pattern of FIGS. 3B and 3C.

The mask designs of both FIGS. 3A and 3B may be input to the mask writer 204 of FIG. 2A to fabricate the actual lithographic mask. However, the mask fabrication process also has effects such that the pattern on the actual mask (the "printed" mask) will not be the same as the mask design input to the mask writer. FIG. 3C depicts a printed mask resulting from the mask design of FIG. 3B. FIG. 3D compares the mask design of FIG. 3B and the resulting printed mask pattern of FIG. 3C. The sharp edges of the mask design have been smoothed out in the printed pattern by the mask fabrication process. The mask fabrication model 135 in FIG. 1 accounts for effects introduced by the mask fabrication process.

Figure 4:
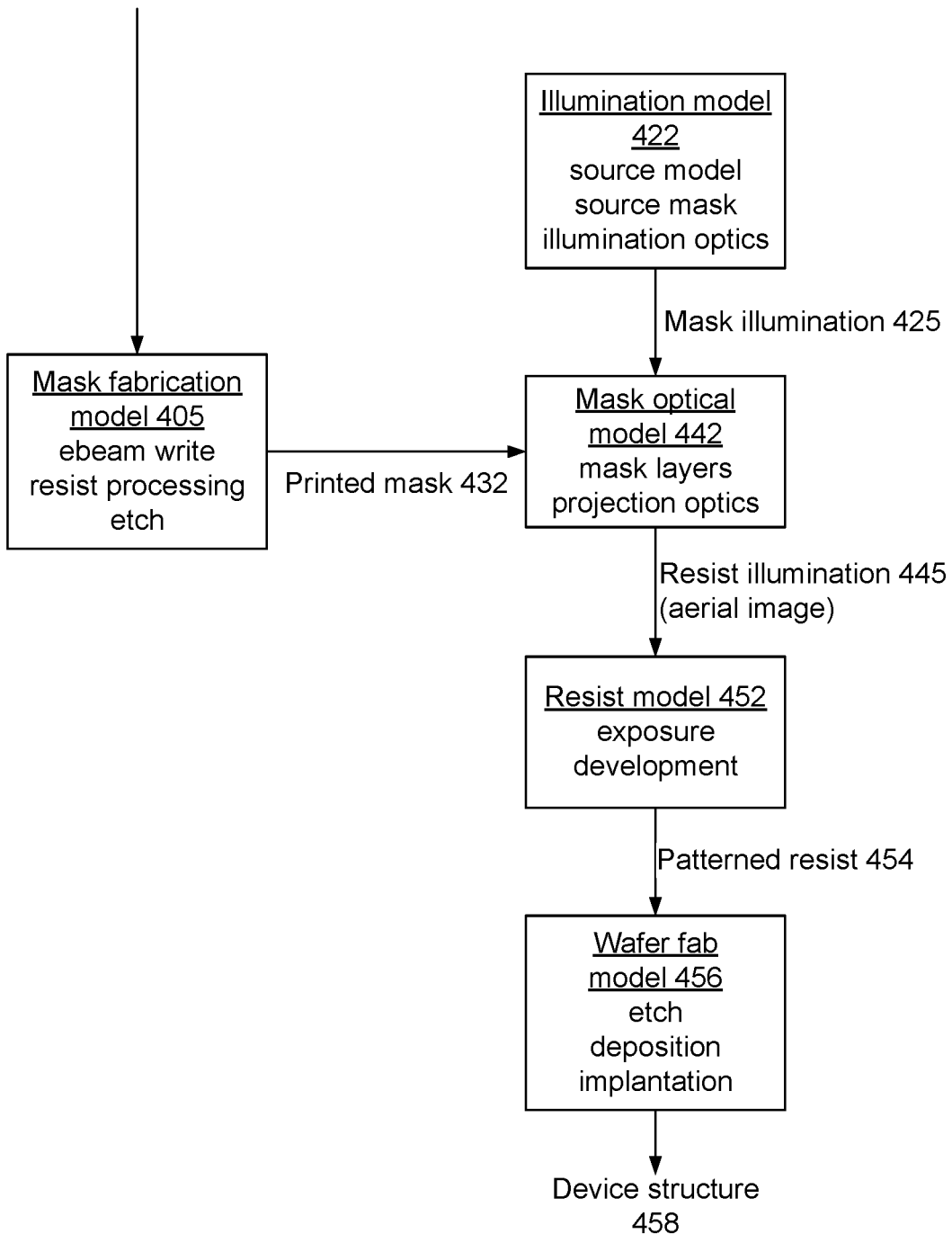
FIG. 4 depicts a simulation of a lithography process, including the mask fabrication process.

FIG. 4 depicts a simulation of the processes shown in FIGS. 2A and 2B, including the mask fabrication process. The mask fabrication process of FIG. 2A is represented by model 405. The input is a mask design 402, such as in FIG. 3B, and the output is the corresponding printed mask pattern 432, such as in FIG. 3C. If the lithographic mask is fabricated using an e-beam process, the mask fabrication model 405 may account for electron-beam exposure of the resist on the mask blank, processing of the exposed resist to form patterned resist, and/or etching of the layers on the mask blank with the patterned resist. Effects encountered during mask fabrication may include back scattered electrons, long range etch effects, etch bias, and micro loading. These effects may be accounted for by simulating the underlying processes or by modeling the effects in other ways, such as stochastically based on empirical data. In one approach, the mask fabrication model is constructed from a combination of Gaussian kernels. This is a reasonable approximation of an e-beam but has little bearing on the etch process. The Gaussian parameters (radius, sigma) for each kernel are regressed against measured mask data so that the model produces a reasonable fit to the empirical data.

Simulation of the lithography process of FIG. 2B is shown by the right column of boxes. Illumination model 422 models the source 210 (including source mask) and illumination optics 220 of FIG. 2B. These are used to predict the light pattern 425 that illuminates the mask. Model 442 accounts for the effect of the lithographic mask 230 (mask 432 in FIG. 4) and projection optics 240, to predict the illumination 445 exposing the resist. This is sometimes referred to as the aerial image 445. The resist model 452 may include effects such as exposure of the resist from the aerial image, chemical development, and subsequent removal, whether by etch or other processes. The removal of resist leaves a layer of patterned resist 454 over the wafer. The wafer fab model 456 then models subsequent processing, for example, etching, deposition, doping, implantation, etc., resulting in device structure 458 on the wafer.

For convenience, separate boxes are shown in FIG. 4 to correspond to physical components or processes, but the models need not be implemented in this way. For example, the illumination model 422 and resist model 452 are depicted as two separate models separated by the mask optical model 442. However, actual implementations may or may not use separate models 422, 452. In some cases, the source model 422, projection optics from element 442, and resist exposure from element 452 may be combined into a single model that predicts the resulting patterned resist, or an equivalent aerial image, from the printed mask pattern 432. Such a single model includes effects from the source, optics and resist.

In some cases, the overall model is a compact model for full chip evaluation. The compact model is designed to process the necessary mask design for an entire die in a rapid manner. As many as $10^{18}$ or more simulations may be necessary to complete a full chip correction on a device such as a microprocessor. This model typically simulates the lithography process, including the mask optical effect, optics, and the photoresist processing. This model may also include the etch process.

The models may also include stochastic models. For example, in a first principles approach, components of the lithography process, such as photon distribution, secondary electron distribution, photo acid generator (PAG) distribution, quencher distribution, and inhibitor distribution, may be randomized. These are varied pseudo random numbers. This creates a situation where defects form due to issues such as too many photons in a local area or too little acid in a local area, etc.

The models shown in FIG. 4 may be based on empirical data. For example, the mask fabrication model may be a parameterized model, with the parameters determined based on regression against empirical data. The same approach may be taken for any of the other models. Compact models for the lithography process are often based on empirical data. Measured data is collected for different mask designs. These may be mask designs, with or without correction. The resulting patterns fabricated on the wafer are measured. These are typically Critical Dimension Scanning Electron Microscope (CDSEM) measurements of photoresist and/or etch structures. Other measurements such as atomic force microscopy (AFM) may also be used.

Separate models may be regressed against different empirical data, unlike a traditional lumped model approach where all effects are considered in one model and regressed against a common set of empirical data. For example, the mask fabrication model would be regressed against empirical data collected by the mask maker, whereas the other lithography process models would be regressed against empirical data collected by the wafer manufacturer (foundry).

One measure of the quality of patterned resist 454 is the critical dimension (CD). CD is the dimension of important features in the patterned resist. Typically, the CD is the smallest line width or space width printed in the resist. As such, it is a measure of the resolution of the resist and lithography process. Referring again to FIG. 1, the simulation result in FIG. 1 may include CD. The lithography simulation 130 may use any of the models shown in FIG. 4 to predict the CDs for a given lithography configuration and mask design.

In FIG. 1, different types of mask correction 150 may also be used. Mask corrections include optical proximity correction, sub-resolution assist features, phase shifting masks, inverse lithography techniques and other types of resolution enhancement technologies. In optical proximity correction (OPC), the geometric shapes in the mask design are perturbed based on the predicted result. FIG. 3B is an example of a mask design corrected using OPC. In sub-resolution assist features, sub-wavelength features are added to or removed from the mask design to introduce beneficial diffraction and scattering. In phase-shifting masks, different mask shapes introduce different amounts of phase shift to introduce beneficial interference in the resulting illumination patterns.

The mask correction may be implemented by a "correction set," which is a set of computer instructions as a script or program that performs pattern manipulation of the mask design to implement the mask correction.

Iterations may end 140 on different criteria. One criteria is based on performance of the mask. Once the simulation result reaches an acceptable level or the improvement falls below a certain rate, the iterations end. Alternatively, the process may run for a fixed number of iterations.

Figure 5:
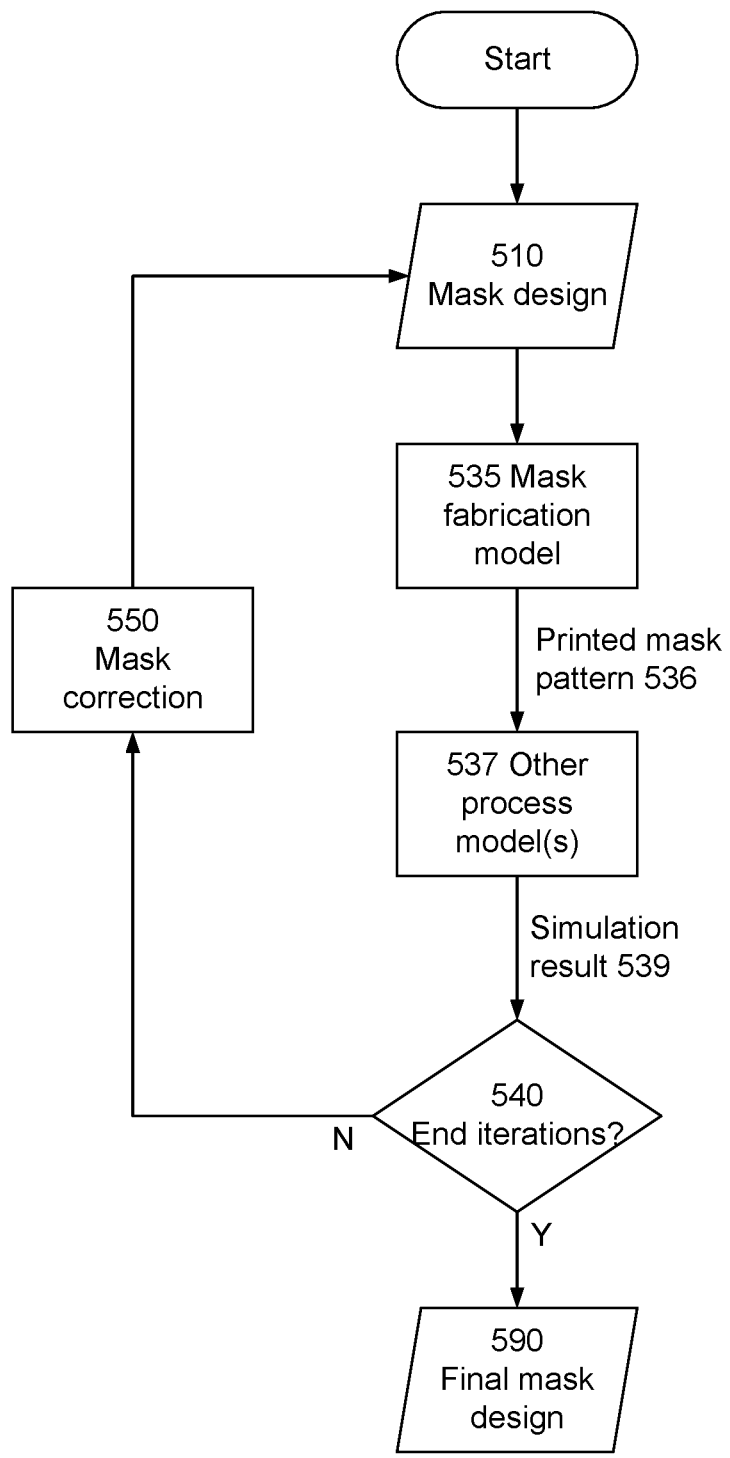
FIG. 5 depicts a flowchart for improving a design of a lithographic mask in accordance with some embodiments of the present disclosure.

FIG. 5 depicts a flowchart for improving a design of a lithographic mask in accordance with some embodiments of the present disclosure. In FIG. 5, the mask fabrication model 535 is used to expressly calculate the printed mask pattern 536 from the current mask design 510. The printed mask pattern 536 is then used as the mask pattern for the rest of the process models 537, generating the simulation result 539. For example, the aerial image and corresponding CD may be estimated using the printed mask pattern 536, rather than the mask design 510, as input to the optics model. Note that if the mask design 510 has rectilinear geometry, the printed mask pattern 536 typically will include curved shapes as the sharp corners are rounded. The optics model 537 will then have to accommodate curved shapes. Mask corrections 550 are applied iteratively 540 until reaching the final mask design 590.

In addition, the lithographic mask and the aerial image may be at different magnifications in the physical system. For example, the projection optics may demagnify the lithographic mask by a factor of 4:1 when imaging onto the wafer. In one approach, the mask design 510 is represented in the design database at the wafer scale. To model the mask fabrication process, the mask design 510 is magnified by 4×, the mask fabrication model 535 is applied, and then the resulting printed mask pattern 536 is demagnified by 4× to return to the wafer scale.

Figure 6:
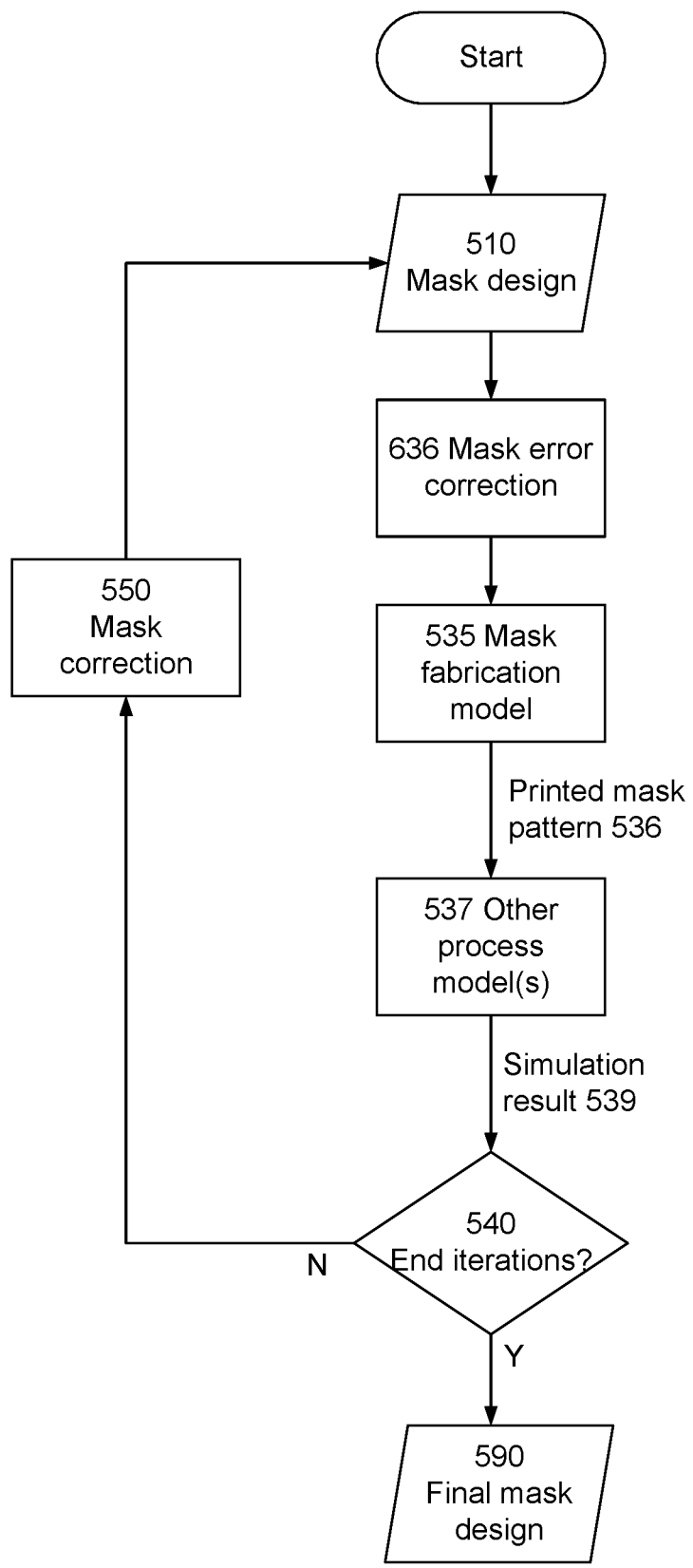
FIG. 6 depicts a flowchart for improving a design of a lithographic mask, including mask error correction, in accordance with some embodiments of the present disclosure.

FIG. 6 depicts a flowchart for improving a design of a lithographic mask, including mask error correction, in accordance with some embodiments of the present disclosure. Mask error correction 636 is applied as part of the mask fabrication process shown in FIG. 2A. Rather than driving the e-beam writer 204 with the mask design 510, that design data may first be corrected and then sent to the e-beam writer. That mask error correction 636 may also be accounted for in the simulation shown in FIG. 6. Note that the mask error correction 636 and mask correction 550 are not the same. Mask error correction 636 is correction of the mask data used by the e-beam writer to account for effects in the mask fabrication process of FIG. 2A. Mask correction 550 is correction of the mask design to account for effects in the lithography process of FIG. 2B.

Table 1 below shows results comparing OPC with a separate mask fabrication model ("M+OPC" correction) against traditional OPC which does not have a separate mask fabrication model ("OPC" correction). Four different cases #1-4 are compared. Avg CD and St Dev CD are the average and standard deviation of measured CDs. Counts are the number of features measured for that case, and failures are the number of failures within that count. The failure rate is expressed in the last column as 1 in X. The results show an approximately 50% reduction in the defect rate for the M+OPC approach and an approximately 20% reduction in line edge roughness (St Dev of CD).

TABLE 1

Comparison of OPC results, with and without mask fabrication model

| Case | Correction | Avg CD | St Dev CD | Count | Failures | Rate (1 in X) |
|---|---|---|---|---|---|---|
| 1 | M&OPC | 14.3 | 2.69 | 1946 | 6 | 321 |
| 1 | OPC | 13.7 | 3.1 | 4750 | 22 | 216 |
| 2 | M&OPC | 15.0 | 2.35 | 1964 | 2 | 982 |
| 2 | OPC | 14.8 | 2.66 | 4870 | 10 | 487 |
| 3 | M&OPC | 14.41 | 2.66 | 9838 | 26 | 378 |
| 3 | OPC | 13.6 | 3.93 | 4690 | 52 | 90 |

TABLE 1-continued

Comparison of OPC results, with and without mask fabrication model

| Case | Correction | Avg CD | St Dev CD | Count | Failures | Rate (1 in X) |
|---|---|---|---|---|---|---|
| 4 | M&OPC | 15.2 | 2.39 | 9896 | 8 | 1237 |
| 4 | OPC | 14.76 | 2.71 | 4868 | 9 | 541 |

Figure 7:
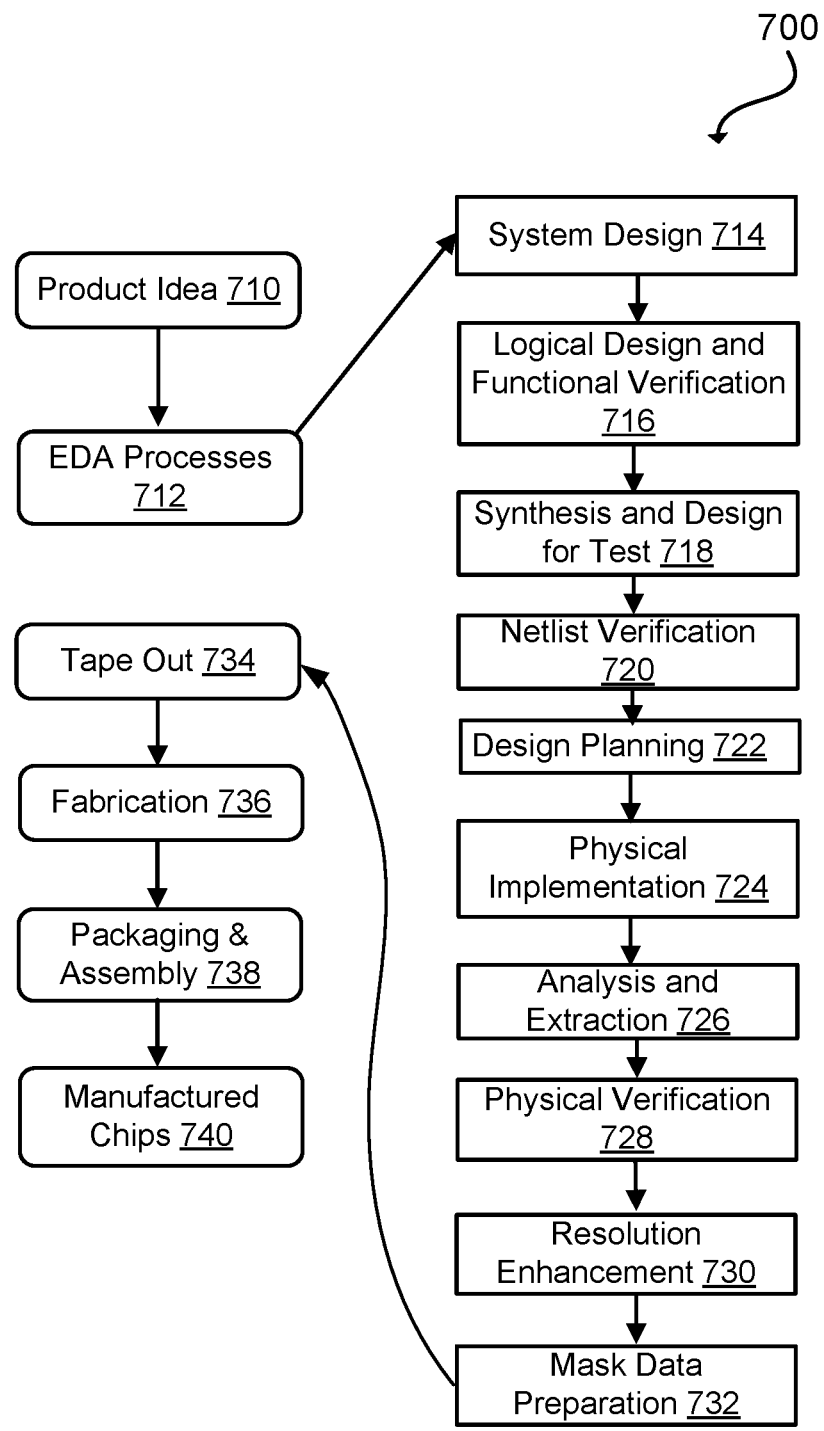
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
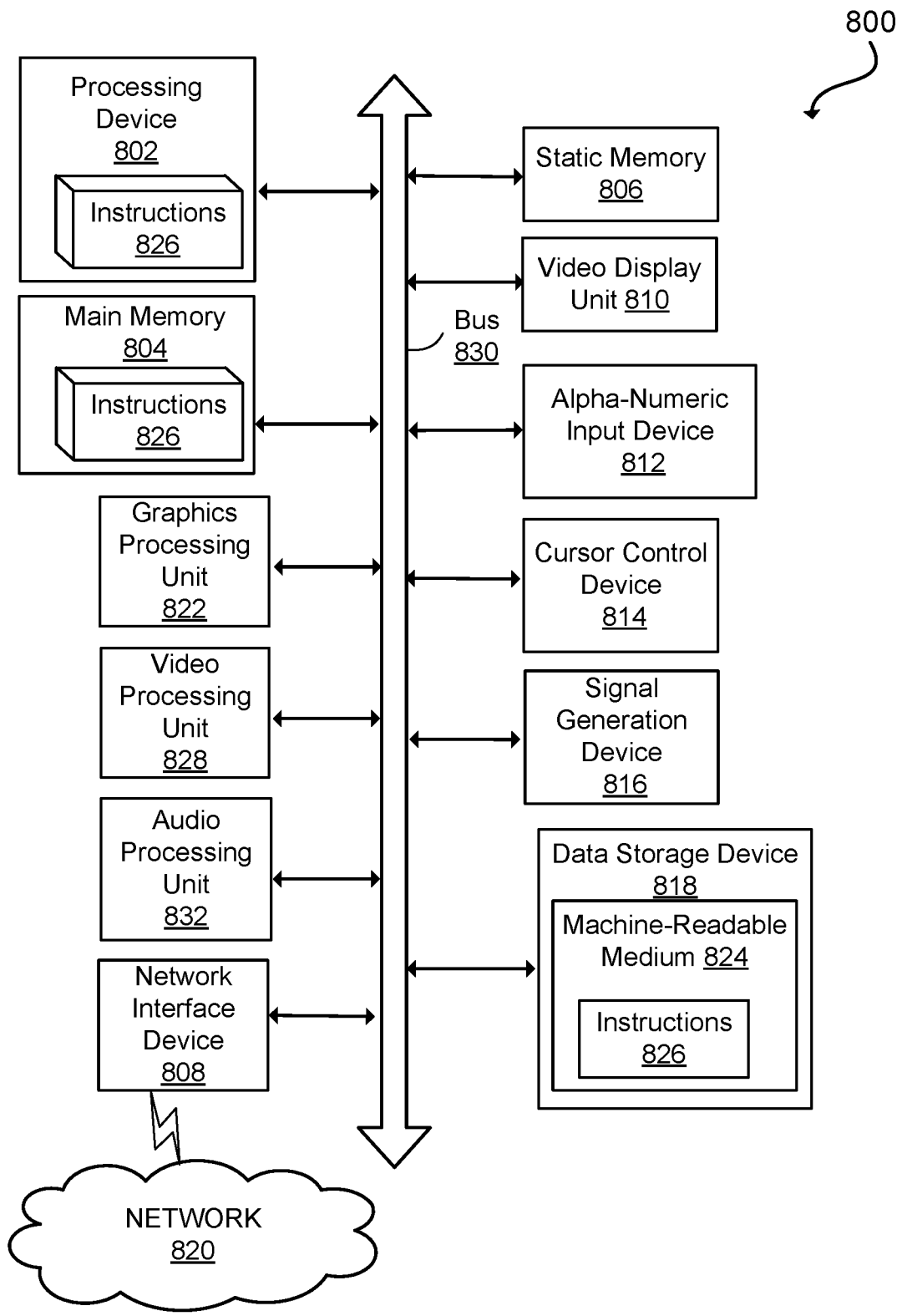
FIG. 8 depicts an abstract diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
  accessing a lithographic mask design for use with a mask fabrication process and a lithography process, wherein the mask fabrication process fabricates a lithographic mask from the lithographic mask design, and the lithography process uses the fabricated lithographic mask to fabricate structures on a wafer;
  estimating by a processor a result of the lithography process; wherein the result comprises at least one or more of an aerial image, a printed wafer pattern, and a metric for one or more of the aerial image and the printed wafer pattern; and
  estimating the result comprises:
    using a mask fabrication model for the mask fabrication process to estimate a printed mask pattern for the lithographic mask fabricated from the lithographic mask design; and
    estimating the result of the lithography process using the printed mask pattern that was estimated using the mask fabrication model as input to one or more additional process models of the lithography process; and
  applying a mask correction to the lithographic mask design based on the estimated result.

2. The method of claim 1 wherein the lithographic mask is fabricated using an electron-beam process; and the mask fabrication model accounts for electron-beam exposure of resist on a mask blank, processing of the exposed resist to form patterned resist, and etching of the mask blank with the patterned resist.

3. The method of claim 1 wherein the lithographic mask is fabricated using an electron-beam process; and the mask fabrication model accounts for at least one of back scattered electrons, long range etch effects, etch bias, and micro loading in the process for fabricating the lithographic mask.

4. The method of claim 1 wherein the lithographic mask design consists of rectilinear shapes and the printed mask pattern comprises curved shapes.

5. The method of claim 1 wherein the mask fabrication model is based on regression against empirical data, and at least one of the additional process models is based on a separate regression against different empirical data.

6. The method of claim 1 wherein the mask fabrication model is applied at one scale to estimate the printed mask pattern, and the estimated printed mask pattern is demagnified to a smaller scale for use as input to the one or more additional process models.

7. The method of claim 1 wherein the method is repeated for multiple iterations, and the mask fabrication model is applied at every iteration.

8. The method of claim 1 wherein the mask fabrication model is based on Gaussian kernels.

9. The method of claim 1 wherein estimating the result of the lithography process is further based on a mask error correction of the lithographic mask design arising from the mask fabrication.

10. The method of claim 1 wherein the mask correction comprises at least one of optical proximity correction, sub-resolution assist features, phase shifting masks, and inverse lithography techniques.

11. A system comprising:
- a memory storing instructions and a lithographic mask design for use with a mask fabrication process and a lithography process, wherein the mask fabrication process fabricates a lithographic mask from the lithographic mask design, and the lithography process uses the fabricated lithographic mask to fabricate structures on a wafer; and
- a processor, coupled with the memory and to execute the instructions, the instructions when executed cause the processor to:
  - estimate a result of the lithography process; wherein the result comprises at least one or more of an aerial image, a printed wafer pattern, and a metric for one or more of the aerial image and the printed wafer pattern; and estimating the result comprises:
    - using a mask fabrication model for the mask fabrication process to estimate a printed mask pattern for the lithographic mask fabricated from the lithographic mask design; and
    - estimating the result of the lithography process using the printed mask pattern that was estimated using the mask fabrication model as input to the one or more additional process models of the lithography process; and
  - apply a mask correction to the lithographic mask design based on the estimated result.

12. The system of claim 11 wherein the lithography process operates at an extreme ultraviolet (EUV) wavelength range and at a technology node with feature sizes of approximately 20 nm or smaller.

13. The system of claim 11 wherein the lithographic mask design is for an entire integrated circuit die.

14. The system of claim 11 wherein the mask fabrication model is based on regression against empirical data, and at least one of the additional process models is based on a separate regression against different empirical data.

15. The system of claim 11 wherein the mask correction comprises at least one of optical proximity correction, sub-resolution assist features, phase shifting masks, and inverse lithography techniques.

16. A non-transitory computer readable medium comprising stored instructions, which when executed by a processor, cause the processor to:
- access a lithographic mask design for use with a mask fabrication process and a lithography process, wherein the mask fabrication process fabricates a lithographic mask from the lithographic mask design, and the lithography process uses the fabricated lithographic mask to fabricate structures on a wafer;
- estimate a result of the lithography process; wherein the result comprises at least one or more of an aerial image, a printed wafer pattern, and a metric for one or more of the aerial image and the printed wafer pattern; and estimating the result comprises:
  - using a mask fabrication model for the mask fabrication process to estimate a printed mask pattern for the lithographic mask fabricated from the lithographic mask design; and
  - estimating the result of the lithography process using the printed mask pattern that was estimated using the mask fabrication model as input to one or more additional process models; and
- apply a mask correction to the lithographic mask design based on the estimated result.

17. The non-transitory computer readable medium of claim 16 wherein the mask fabrication model is applied at one scale to estimate the printed mask pattern, and the estimated printed mask pattern is demagnified to a smaller scale for use as input to the one or more additional process models.

18. The non-transitory computer readable medium of claim 16 wherein the mask fabrication model is based on Gaussian kernels.

* * * * *